US012597461B2

(12) United States Patent
Goncalves et al.

(10) Patent No.: US 12,597,461 B2
(45) Date of Patent: Apr. 7, 2026

(54) MEMORY DEVICE

(71) Applicant: STMICROELECTRONICS INTERNATIONAL N.V., Geneva (CH)

(72) Inventors: Christophe Goncalves, Puyloubier (FR); Marc Battista, Allauch (FR); Francois Tailliet, Fuveau (FR)

(73) Assignee: STMicroelectronics International N.V., Geneva (CH)

( * ) Notice: Subject to any disclaimer, the term of this patent is extended or adjusted under 35 U.S.C. 154(b) by 114 days.

(21) Appl. No.: 18/583,574

(22) Filed: Feb. 21, 2024

(65) Prior Publication Data

US 2024/0304237 A1 Sep. 12, 2024

(30) Foreign Application Priority Data

Mar. 7, 2023 (FR) ...................................... 2302105

(51) Int. Cl.
*G11C 11/4091* (2006.01)
*G11C 11/4096* (2006.01)
*G11C 11/4099* (2006.01)

(52) U.S. Cl.
CPC ...... *G11C 11/4091* (2013.01); *G11C 11/4096* (2013.01); *G11C 11/4099* (2013.01)

(58) Field of Classification Search
CPC .......................... G11C 11/4091; G11C 11/409
USPC ....................................................... 365/205
See application file for complete search history.

(56) References Cited

U.S. PATENT DOCUMENTS

| | | | | |
|---|---|---|---|---|
| 5,477,484 A | | 12/1995 | Nakashima | |
| 5,774,410 A | * | 6/1998 | Nakase ................. | G11C 11/419 |
| | | | | 365/230.03 |
| 6,009,039 A | * | 12/1999 | Takemae ............... | H03K 5/249 |
| | | | | 365/189.08 |
| 7,542,352 B1 | * | 6/2009 | Kuo ....................... | G11C 16/24 |
| | | | | 365/185.21 |
| 11,183,230 B2 | * | 11/2021 | Ito .......................... | G11C 7/067 |
| 2007/0121377 A1 | * | 5/2007 | Kajiyama .......... | G11C 13/0004 |
| | | | | 257/E27.103 |
| 2011/0273952 A1 | * | 11/2011 | Nii ......................... | G11C 5/063 |
| | | | | 365/226 |
| 2019/0103145 A1 | * | 4/2019 | Tseng ..................... | G11C 16/24 |

FOREIGN PATENT DOCUMENTS

CN          111653299 A          9/2020

OTHER PUBLICATIONS

FR2302105 Search Report and Written Opinion mailed Nov. 17, 2023.

* cited by examiner

*Primary Examiner* — Muna A Techane
(74) *Attorney, Agent, or Firm* — Alston & Bird LLP

(57) ABSTRACT

The present disclosure relates to a memory device including a sense amplifier, wherein the amplifier comprises a first inverter, wherein an input and an output of the inverter are coupled to a first transistor configured to be switched on during a step of pre-charging of a memory cell.

16 Claims, 7 Drawing Sheets

MEMORY DEVICE

CROSS REFERENCE TO RELATED APPLICATIONS

This application claims the priority benefit of French patent application number FR2302105, filed on Mar. 7, 2023, entitled "Dispositif mémoire", which is hereby incorporated by reference to the maximum extent allowable by law.

TECHNICAL FIELD

The present disclosure relates generally to the field of electronic devices, and more specifically relates to memory devices and their reading method.

BACKGROUND

In computer science, memory addressing is the way stored data is accessed. A memory address is an integer that specifies a particular zone of the memory, or only the beginning of a zone. Most often, data can be read or written. A memory device can be volatile (random access memory) for working or non-volatile (non-volatile) for storage.

BRIEF SUMMARY

An embodiment addresses all or a some of the drawbacks of known methods for reading memory devices.

An embodiment provides a method of reading a word in a memory device, wherein the word is comprised in a first set of words that can be read by the memory device, wherein each word of the first set comprises at least one byte of data, each word being contained in memory cells, the method comprising a pre-charging step during which the first set and at least a second set of words are pre-charged, a first terminal of each cell of the first and second sets being floating during the pre-charging step.

According to an embodiment, the word to be read is designated by an address having first, second and third parts, a partial address comprising the first and second parts indicating the first set, a partial address comprising the first part indicating the first and second sets of words, the method comprising:
- a. the reception of the first part;
- b. the pre-charging of the first and second sets of words, the first terminal of each of the cells corresponding to said words being floating;
- c. the reception of the second part;
- d. maintaining the pre-charge of the first set of words only;
- e. reading the first set of words;
- f. the reception of the third part; and
- g. the determination of the addressed word from the read set.

According to an embodiment, the address comprises a line coordinate and a column coordinate.

According to an embodiment, the first part comprises at least the line coordinate.

According to an embodiment, the first part comprises the most significant bits and the third part comprises the least significant bits of the address.

According to an embodiment, the second part comprises only one bit.

According to an embodiment, during the steps e and d, at reception of each bit of the second part, only the pre-charging of the words whose address starts with the known partial address is maintained.

According to an embodiment, the pre-charging comprises applying a first pre-charging voltage value to a second terminal of the pre-charged cell.

According to an embodiment, in the step e, the voltage is no longer maintained at the second terminal of each cell and the value of each cell is determined by the variation of the voltage or of the current on the second terminal of the pre-charged cell with respect to the first value.

According to an embodiment, the first terminal of each cell is coupled to a reference voltage through a transistor that is non-conducting during the pre-charging and conducting during the reading of the word.

According to an embodiment, the pre-charging voltage of each word is provided by a sense amplifier.

According to an embodiment, each sense amplifier pre-charges at least two words read at step e.

Another embodiment provides a memory device comprising a sense amplifier, wherein the amplifier comprises a first inverter, wherein an input and an output of the inverter are coupled to a first transistor configured to be switched on during a step of pre-charging of a memory cell.

Another embodiment provides a method of controlling a memory device comprising a sense amplifier, wherein the amplifier comprises a first inverter, wherein an input and an output of the inverter are coupled to a first transistor, the method comprising switching on the first transistor during a step of pre-charging of a memory cell.

According to an embodiment, the amplifier comprises a NAND logic gate, having a first input coupled to the output of the first inverter and a second input coupled to an application node of a first voltage, the output of the logic gate being coupled to an output of the amplifier.

According to an embodiment, the first voltage is configured to be equal to a second reference voltage during the pre-charging step and to be equal to a third supply voltage during a step of reading the memory cell.

According to an embodiment, the amplifier comprises second and third transistors coupled in series between an application node of the third supply voltage and an application node of the second reference voltage, wherein the midpoint between the second and the third transistors is coupled to the input of the first inverter.

According to an embodiment, the amplifier comprises fourth and fifth transistors coupled in series between an application node of the third supply voltage and a terminal of the memory cell, wherein the fourth transistor is diode-connected, a control terminal of the fourth transistor being coupled to a control terminal of the second transistor.

According to an embodiment, the amplifier comprises sixth and seventh transistors coupled in series between the terminal of the memory cell and an application node of the second reference voltage.

According to an embodiment, the currents through the second and third transistors are substantially equal and depend on the current through the sixth transistor.

According to an embodiment, the device is configured such that, during the pre-charging step, the first voltage is equal to the second reference voltage and the control terminals of the first and seventh transistors are at least equal to the third supply voltage.

According to an embodiment, the device is configured such that, during the reading step, the first voltage is equal to the third supply voltage and the control terminals of the first and seventh transistors are equal to the second reference voltage.

According to an embodiment, the first inverter is configured to be supplied by a fourth voltage applied between the first and the second terminals of the first inverter, wherein the fourth voltage is distinct from the third supply voltage.

According to an embodiment, the fourth voltage has a first value during the pre-charging step and a second value when not in the pre-charging step.

According to an embodiment, the device comprises a generating circuit generating the fourth voltage, wherein the generating circuit comprises a first output terminal configured to be coupled to the first terminal of the first inverter, and a second output terminal configured to be coupled to the second terminal of the first inverter, wherein the first output terminal is coupled to an application node of the third supply voltage by a first resistor and an eighth transistor coupled in parallel, and the second output terminal is coupled to an application node of the second reference voltage by a second resistor and a ninth transistor coupled in parallel, wherein the generating circuit further comprises an input terminal coupled to an application node of the control voltage of the seventh transistor, the input terminal being coupled to a control terminal of the eighth transistor and being coupled, by a second inverter, to a control terminal of the ninth transistor.

BRIEF DESCRIPTION OF DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

During the memory addressing of a data word in a memory device, which means when an element external to the memory device tries to read said data word inside the memory device, the address of the data word is provided to the memory. Once the location of the data word is determined, the data word is read and sent to the external element. However, the delay between the determination of the location and the start of the expedition of the data word depends on the frequency of the clock signal. If the frequency is high, it may not be possible to perform the entire reading operation between the determination of the location and the start of expedition.

In order to read the data word faster, the described embodiments provide, when the address of the data word is only partially known, to apply some steps of the reading method to all the data words that can be treated with a partial address, in particular to apply a charging step, or precharging, to the memory cells.

Figure 1:
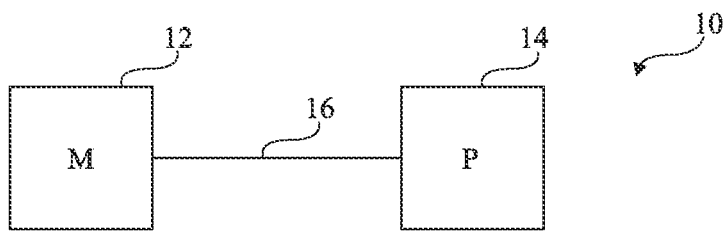
FIG. 1 schematically represents a part of an electronic device.

FIG. 1 schematically represents a part of an electronic device 10.

The electronic device comprises a memory device 12 (M). For example, the memory device 12 is a non-volatile memory device. For example, the memory device 12 is a read-only memory device. For example, the memory device 12 is a read-only memory device that can be electrically erased and programmed (EEPROM). The memory device 12 is an array of memory cells. For example, the memory cells are associated as data words, wherein each data word comprises, for example, eight binary pieces of data, each located in a memory cell. Each data word is located at the intersection of a line and a column of the memory array. Thus, each word is associated to an address that comprises a line component and a column component.

The device 10 also comprises an element 14 (P). The element 14 is able to read inside the memory 12. For example, the element 14 is a processor. For example, the element 14 is a microprocessor. For example, the element 14 is a direct memory access controller.

The memory 12 and the element 14 are coupled via a bus 16. The bus 16 is configured to provide communication between the memory and the element 14. The communication between the memory 12 and the element 14 is two-way. In particular, during the reading of the memory 12, a reading address is provided by the element 14 to the memory 12 and a data word read in memory is provided by the memory 12 to the element 14.

Figure 2:
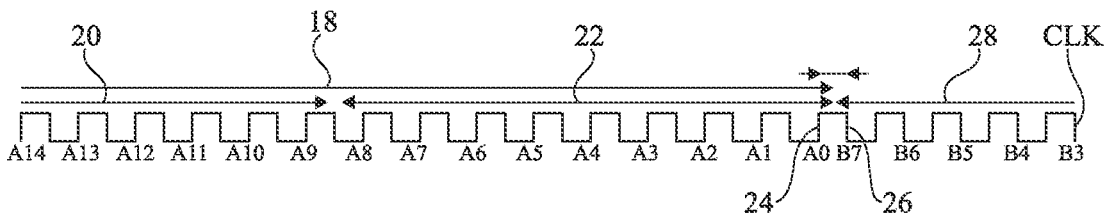
FIG. 2 schematically represents a reading step of a memory device.

FIG. 2 schematically represents a reading step of a memory device, for example the memory device 12 of FIG. 1.

For example, the communication between the memory 12 and the element 14 is synchronous, which means based on a clock signal CLK, which means a periodic binary signal, preferably with a constant period. Thus, FIG. 2 represents the clock signal CLK and shows the signal through the bus 16 during the reading step of the memory 12.

For example, the communication between the memory 12 and the element 14 is simple duplex. Thus, the communication from the memory 12 toward the element 14 and the communications from the element 14 toward the memory 12 are not simultaneous. For example, the binary data that constitutes the communication from the memory 12 toward the element 14 is provided starting from a rising edge of the clock signal CLK and is sampled by the element 14 on the next rising edge. Similarly, the binary data that constitutes the communication from the element 14 toward the memory 12 is provided starting from a falling edge of the clock signal CLK and is sampled by the memory on the next rising edge.

During the reading step of the memory 12, the element 14 transfers to the memory 12 the address 18 of a word of the memory to read. For example, the address 18 comprises 24 bits of address A23 to A0, with only the bits A14 to A0 pictured in FIG. 2. The address 18 comprises a first part 20 that specifies the value of the line and a second part 22 that specifies the value of the column. Thus, the first part is associated with the line component and the second part with the column component. For example, the first part 20 of the address 18 comprises ten bits, for example the bits A18 to A9. For example, the second part 22 of the address 18 comprises nine bits, for example the bits A8 to A0. For example, the five most significant bits, which means the bits A23 to A19, are not used to provide the address.

At reception of the A9 bit by the memory, which means at the rising edge of the CLK signal, where the memory samples the value of the A9 bit, the memory knows the line where the word to read is located. At reception of the A0 bit by the memory, which means at the rising edge 24 of the CLK signal, where the memory samples the value of the A0 bit, the memory knows the column where the word to read is located, hence knows the exact location of the word to read. Then, the memory reads the data and sends it to the element 14 at the next falling edge 26.

Thus, after reading the address, the read data, which means the read word 28, is sent to the bus 16 in synchronicity with the falling edges of the clock signal CLK. For example, the read data comprises the bits B7 to B0, with only the bits B7 to B3 pictured in FIG. 2.

The delay between the reception of the complete address 18 by the memory and the beginning of the sending of data 28, which means the delay between the edges 24 and 26, which means the duration of reading of the data, is half the period of the clock signal CLK.

Figure 3:
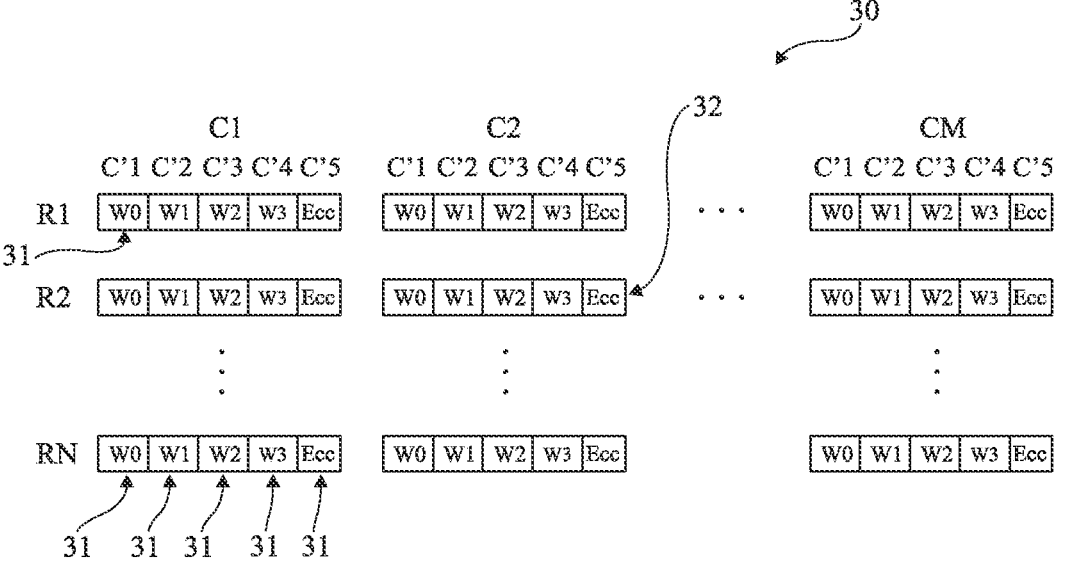
FIG. 3 schematically represents a part of a memory device.

FIG. 3 schematically represents a part of a memory device. More specifically, FIG. 3 pictures a memory array 30 that corresponds, for example, to a part of the memory device 12 of FIG. 1. The memory array 30 corresponds, for example, to a part of the memory device 12, where the reading methods below can be applied.

The memory array 30 contains words 31. Each data word 31 is located at the intersection of a line and a column of the array 30. The array 30 comprises N lines R1 to RN, wherein only three of them are pictured in FIG. 3. The memory array 30 comprises M sets of columns C1 to CM, wherein only three of them are pictured in FIG. 3.

Each set of columns C1 to CM comprises several columns CY' to C'5. In the example of FIG. 3, each set C1 to CM comprises five columns C'1, C'2, C'3, C'4, C'5. The address that corresponds to each word 31 corresponds to a value that corresponds to the line R1 to RN of the word and to a value corresponding to the column C'1 to C'5 of a set of columns C1 to CM.

Each set 32 of words 31 contains a plurality of bits, which means that it corresponds to a plurality of memory cells that each contains a binary value. Each set 32 of words corresponds to a set of words that can be read by the memory.

For example, each set 32 contains data words, for example four data words W0, W1, W2, W3, and a check words Ecc. Each data word W0, W1, W2, W3 comprises, for example, one byte of binary data, which means eight memory cells. The Ecc word contains, for example, check data of the word data W0, W1, W2, W3.

Figure 4:
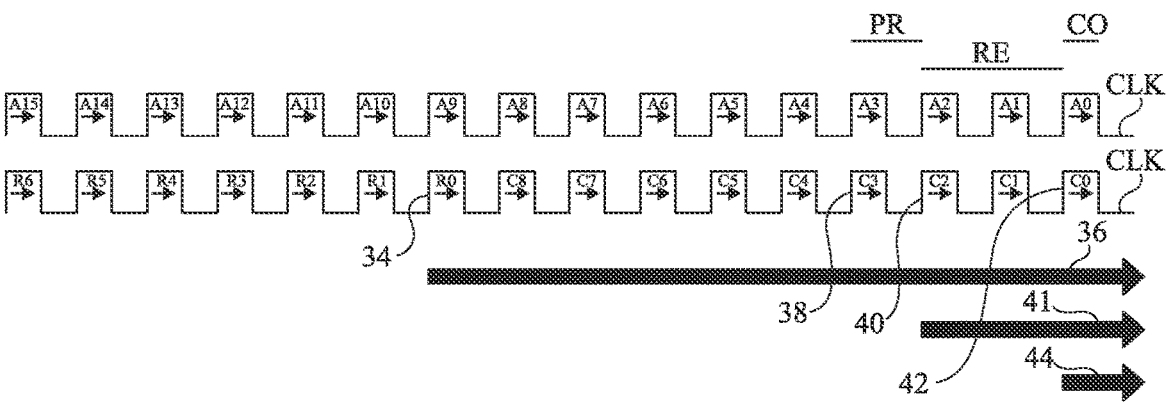
FIG. 4 schematically represents a method of reading a memory device.

FIG. 4 represents an example of a method of reading a memory device. More specifically, FIG. 4 represents, on a clock signal CLK, bits A15 to A0 of an address provided to a memory device. In addition, FIG. 4 represents the bits on the clock signal CLK, wherein the bits correspond to the part of the address that specifies the line and the part of the address that specifies the column.

During the transfer of the address that tells the memory the word 31 to read, the line of the word 31 to read is known from the rising edge 34 corresponding to the bit R0, which means during the duration represented by the arrow 36. From the rising edge 38 associated with the bit C3, the partial address specifies a word 31 that is part of a set of words 32 among two sets 32 of the array 30. Thus, eight data words can be designated by the partial address known by the memory from the rising edge 38.

Between the rising edge 38 and the following rising edge 40, i.e., the rising edge that corresponds to the bit C2, the memory cells corresponding to said two sets 32 of words are pre-charged (PR). The pre-charging step is described more in detail in relationship with FIG. 5.

At the rising edge 40, an additional bit of the address is known. The set 32 of words where the word 31 of the address is located is known from the rising edge 40 corresponding to the bit C2, which means during the duration represented by the arrow 41.

Between the rising edge 40 and a following rising edge 42, i.e., the rising edge that corresponds to the bit C2, which means the edge from which all the address is known to the memory device, the memory device reads the set 32 of words that contains the word sent. The reading step (RE) is described more in detail below.

From the rising edge 42 corresponding to the bit C0, which means during the duration represented by the arrow 44, the memory determines which word 31 among the data words 31 of the read set 32 matches the address. Then, for example, this word is sent at each falling edge of the clock signal CLK.

Before sending the addressed word, a fixing step (CO) can be implemented in order to check that the words 31 of the set 32 have been accurately read. For example, the fixing step used the checking word Ecc of the set 32 that matches an error-correcting code.

Figure 5:
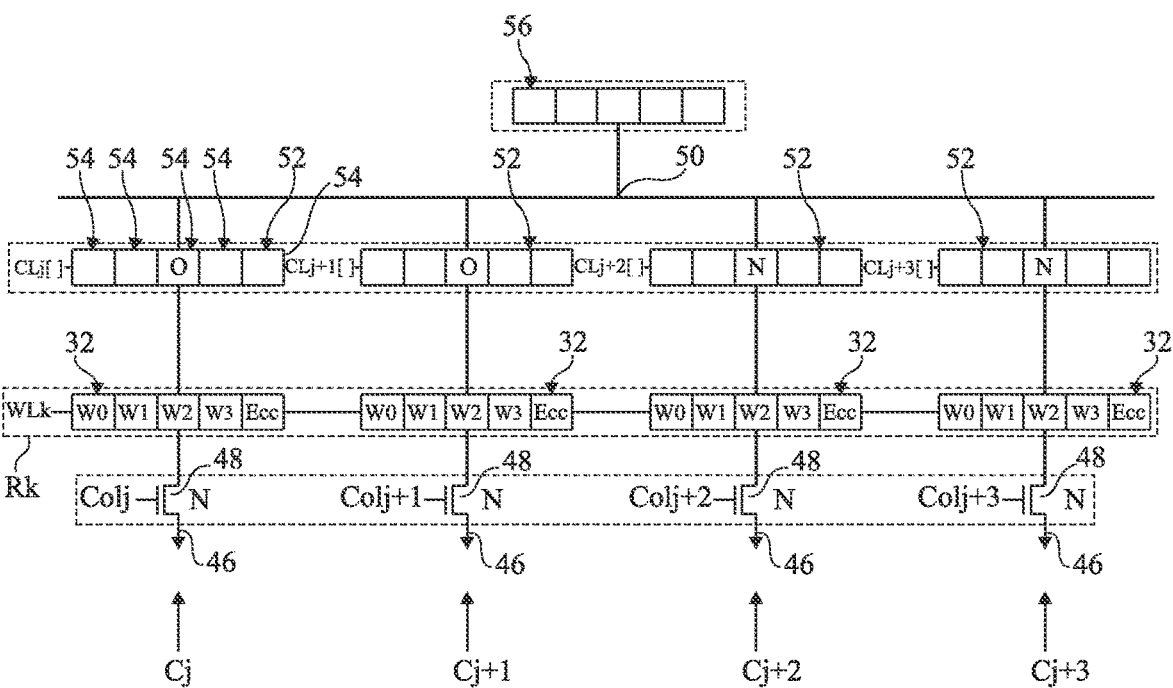
FIG. 5 schematically represents a step in the method of FIG. 4.

FIG. 5 schematically represents a step in the method of FIG. 4. More specifically, FIG. 5 shows the pre-charging step PR of the embodiment according to FIG. 4.

FIG. 5 shows four sets of words 32. The four sets of words 32 are in a same line Rk of the memory array. Each set of words 32 preferably contains four data words W0, W1, W2, W3, and a check words Ecc, as previously described.

At the moment that matches the rising edge 38 of FIG. 4, the partial address can specify a word among two or the four sets of words of FIG. 5. Thus, the word to read is contained in one of the two leftmost sets 32 of FIG. 5. The rightmost sets 32 of FIG. 5 are not designated by the partial address.

Each word of each set 32 contains at least one bit of data contained in a memory cell. Thus, each data word 31 is contained, for example, in eight memory cells and each check word is contained, for example, in six memory cells. For example, the memory cells containing word data bits of a same line have a terminal that receives a same word line voltage WLk.

Each set 32 is coupled to an application node 46 of a reference voltage, for example the ground, through a transistor 48. More specifically, each memory cell of a word 31 of a set 32 is coupled to the application node 46 of a reference voltage, for example the ground, through a transistor 48.

For example, the memory comprises M transistors 48, which means as many transistors 48 as there are sets C1 to CM of columns. Preferably, all the memory cell of a same set 32 of words are coupled to the application node 46 of a reference voltage, for example the ground, through a transistor 48.

The transistors 48 are controlled by distinct control voltages. Thus, in FIG. 5, the transistors 48 of the sets Cj, Cj+1, Cj+2 et Cj+3 of columns are respectively controlled by voltages Colj, Colj+1, Colj+2 and Colj+3.

In addition, each memory cell is coupled, preferably connected, to a pre-charging node 50 through a transistor 52. Although only one node 50 is displayed in FIG. 5, the memory comprises, for example, as many nodes 50 as there are memory cells in a set 32 of words 31. Preferably, one memory cell of each set 32 of words 31 is coupled to each node 50. For example, all first cells of the first words W0 are coupled to a same node 50, all second cells of the first words W0 are liked to a same node 50, etc.

Preferably, the various memory cells of the memory array are coupled to the corresponding node 50 through different transistors 52. Thus, the memory comprises, for example, as many transistors 52 as there are memory cells in a line. In FIG. 5, the transistor 52 are represented by blocs 54 that correspond each to the transistors 52 of a word 31.

For example, each transistor 52 receives a control voltage. In FIG. 5, all the control voltages of each set of transistors 52 are represented by a signal. Thus, the transistors 52 that correspond to the cells of the set Cj, respectively Cj+1, Cj+2, Cj+3, are controlled by voltages in a set of voltages Clj[ ], respectively CLj+1[ ], CLj+2[ ], CLj+3[ ], comprising as many values as there are transistors 52 in said set of transistors 52. Preferably, all the voltages of a set CLj[ ], CLj+1[ ], CLj+2[ ] or CLj+3[ ] are equal to each other. Thus, for example, each transistor 52 corresponding to the cells of a set Cj, Cj+1, Cj+2, or Cj+3, is controlled by a same signal.

In addition, the memory comprises sense amplifiers that are pictures in FIG. 5 by the blocks 56. The memory device comprises preferably as many sense amplifiers as there are memory cells in a set 32. Each sense amplifier is configured to generate a pre-charging voltage on one of the nodes 50. In other words, each node 50 is coupled, preferably connected, to an output node of a sense amplifier and receives the pre-charging voltage that is generated by said amplifier. Each amplifier is coupled to only one node 50. Similarly, each node 50 is coupled to only one amplifier. Thus, each amplifier is coupled to a memory cell of each set 32.

During the pre-charging step PR, all the transistors 48 are non-conducting (N). In other words, the control voltages Col1 to ColM of the transistors 48 are configured to place the transistors 48 in a non-conducting state. In addition, the transistors 52 of the sets of words 32 that can comprise the word to read, i.e., at the rising edge 38, the two left sets 32 in FIG. 5 are configured to be on (O). In other words, the control voltages CLj[ ] and CLj+1[ ] are configured to turn on the corresponding transistors. The transistors 52 of all the other sets 32 of words are configured to be non-conducting.

In addition, at the pre-charging step, a pre-charging voltage is generated by the amplifiers on the nodes 50. Thus, each memory cell receives a voltage on one of its terminals that makes it possible to read the cell.

Thus, each pre-charged memory cell comprises a terminal that receives a pre-charging voltage and a terminal coupled, preferably connected, to a floating node.

Figures 6, 7:
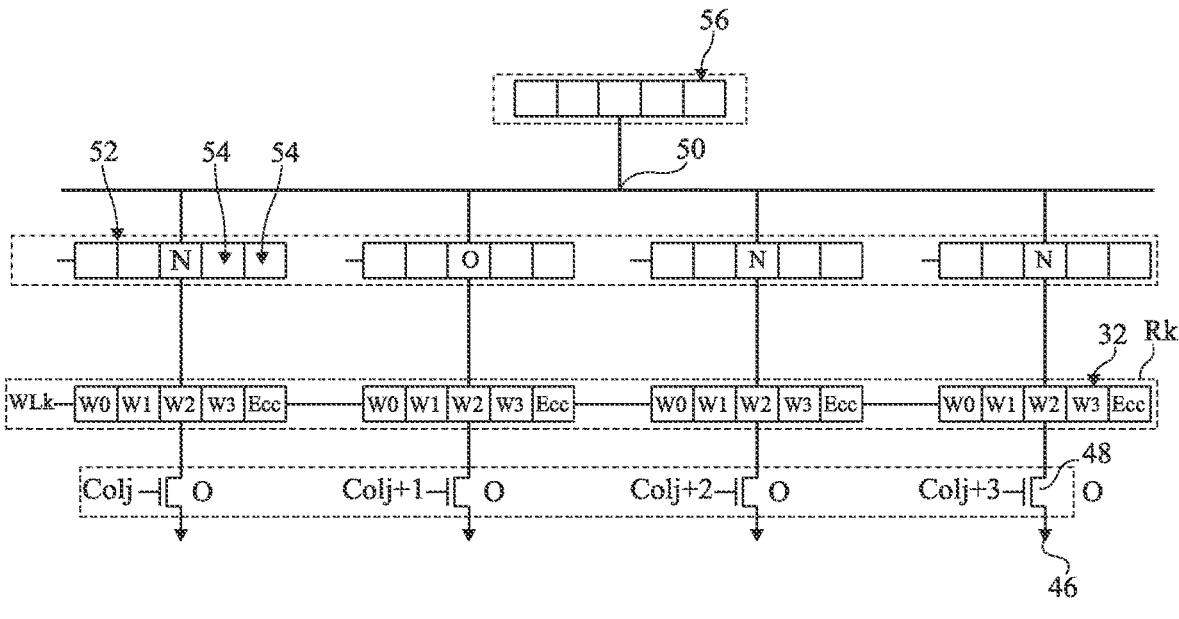
FIG. 6 schematically represents a step in the method of FIG. 4.
FIG. 7 schematically represents a step in the method of FIG. 4.

FIG. 6 schematically represents a step in the method of FIG. 4. More specifically, FIG. 6 shows the circuit of FIG. 5 during the reading step (RE).

For example, during this step, after the rising edge 40, the sense amplifiers no longer generate the pre-charging voltages. In addition, the transistors 48 are on (O). In other words, the control voltages Col1 to ColM of the transistors 48 are configured to turn on the transistors 48.

In addition, the set 32 of words comprising the word 31 addressed by the complete address is known from the time of the rising edge 40, which means the beginning of the reading step. The transistors 52 corresponding to the set 32 comprising the addressed word are maintained on (O) and the other transistors 52 comprising the transistors associated to the other pre-charged set 32 are non-conducting (N).

Thus, the memory cells of the set 32 comprising the addressed word can be read, for example by determining the current through the nodes 50.

FIG. 7 schematically represents a step in the method of FIG. 4. More specifically, FIG. 7 shows a variant of the step of FIG. 6.

The variant of FIG. 7 differs from the variant of FIG. 6 in that, in the variant of FIG. 7, only the transistors 48 associated with the set 32 that is read during the reading step are on. The other transistors 48, comprising the transistors associated to the other pre-charged set 32, are non-conducting (N).

Figure 8:
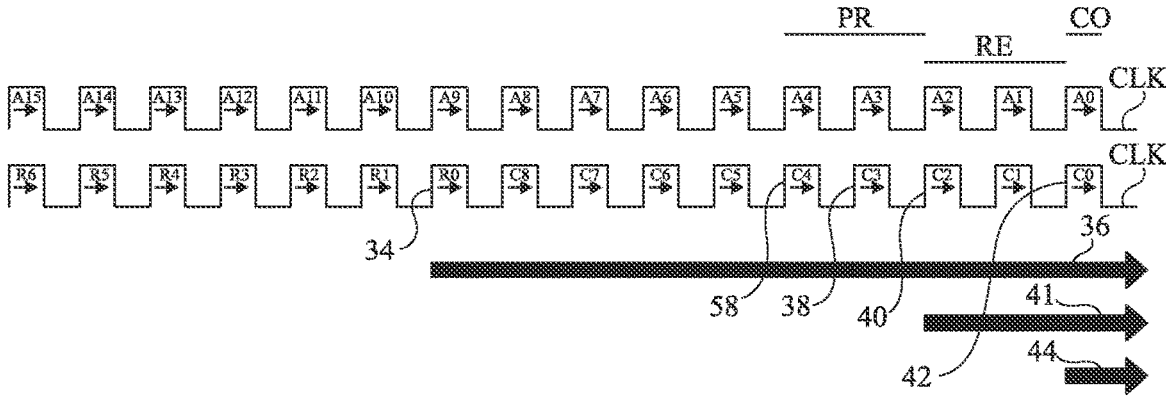
FIG. 8 schematically represents another embodiment of a reading method.

FIG. 8 schematically represents another embodiment of a reading method. More specifically, FIG. 8 represents, as in FIG. 4, on a clock signal CLK, bits A15 to A0 of an address provided to a memory device. In addition, FIG. 8 represents the bits on the clock signal CLK, wherein the bits correspond to the part of the address that specifies the line and the part of the address that specifies the column.

The method of FIG. 8 differs from the method of FIG. 4 in that the pre-charging step is made from a rising edge 58. The rising edge 58 corresponds to the bit C4. Thus, the rising edge is the one immediately preceding the edge 38.

From the rising edge 58 associated with the bit C4, the partial address specifies a word 31 that is part of a set of words 32 among four sets 32 of the array 30. Thus, sixteen data words can be designated by the partial address known by the memory from the rising edge 58.

Between the rising edge 58 and the rising 40, which means two periods of the clock signal CLK, the memory cells corresponding to said four sets 32 of words are pre-charged (PR). The pre-charging step is described in more detail in relation with FIG. 9.

At the rising edge 40, the set 32 of words where the addressed word 31 of the address is known. Between the rising edge 40 and a following rising edge 42, i.e., the rising edge that corresponds to the bit C2, which means the edge from which all the address is known to the memory device, the memory device reads the set 32 of words that contains the word sent. The reading step RE is described in more detail below.

Figure 9:
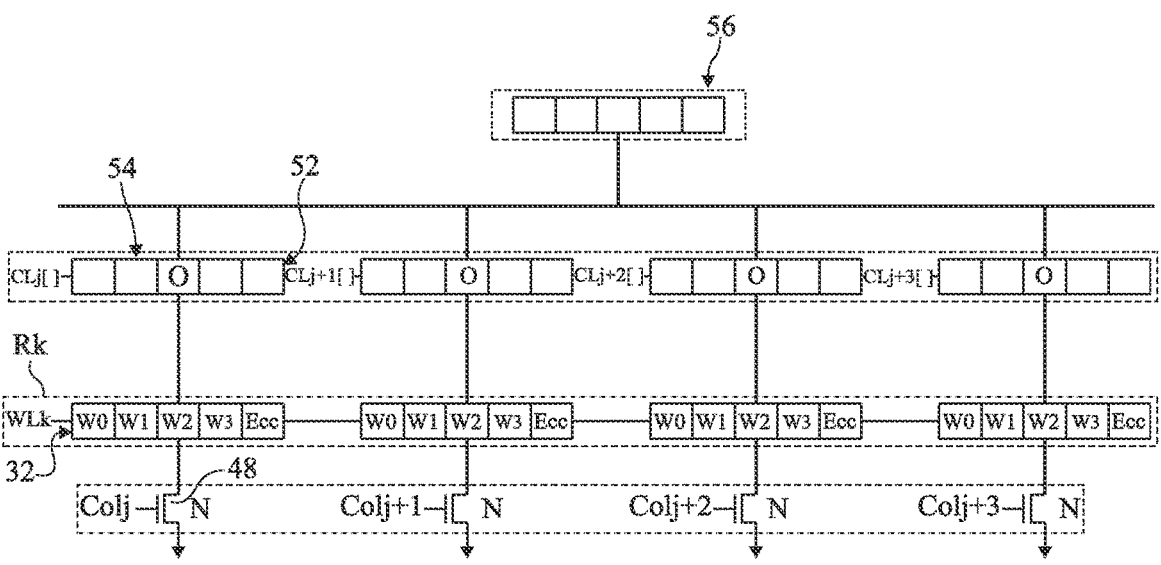
FIG. 9 schematically represents a step in the method of FIG. 8.

FIG. 9 schematically represents a step in the method of FIG. 8. More specifically, FIG. 9 shows the pre-charging step PR of the embodiment according to FIG. 8.

FIG. 9 differs from the step of FIG. 5 in that four sets 32 are pre-charged. Thus, the transistors 52 associated to the four sets 32 that can be addressed by the partial address are switched on. The other transistors 52 are non-conducting. In the example of FIG. 9, the four displayed sets 32 correspond to the four sets that can be addressed by the address. As at the step of FIG. 5, the transistors 48 are all non-conducting.

Thus, each pre-charged memory cell, i.e., each cell of the four sets 32 that can be addressed by the address, comprises a terminal that receives a pre-charging voltage and a coupled terminal, preferably connected, to a floating node.

Figure 10:
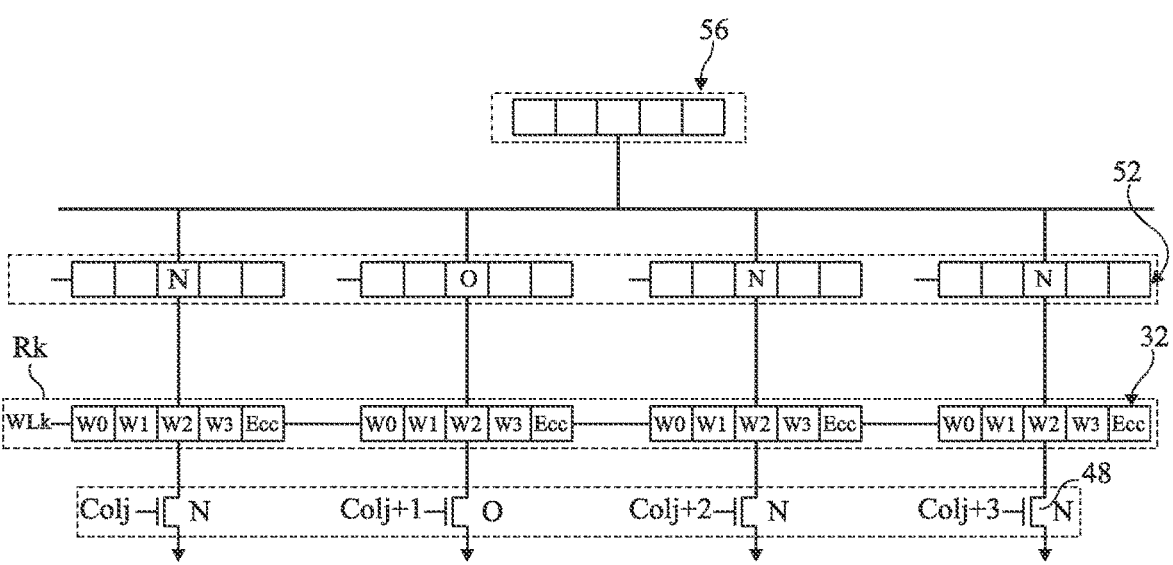
FIG. 10 schematically represents a step in the method of FIG. 8.

FIG. 10 schematically represents a step in the method of FIG. 8. More specifically, FIG. 10 shows the circuit of FIG. 8 during the reading step (RE).

The reading step of FIG. 10 is similar to the reading step of FIG. 7. In other words, during this step, after the rising edge 40, the sense amplifiers no longer generate the pre-charging voltages.

The set 32 of words comprising the word 31 addressed to by the complete address is known as soon as the rising edge 40, which means the beginning of the reading step. The transistors 52 corresponding to the set 32 comprising the addressed word are maintained on (O) and the other transistors 52 comprising the transistors associated to the other pre-charged set 32 are non-conducting (N).

In addition, the transistors 48 associated with the set 32 that is read during the reading step, which means the set where the word 32 to read is located, are on. The other transistors 48, comprising the transistors associated to the other pre-charged sets 32, are non-conducting (N).

Thus, the memory cells of the set 32 comprising the addressed word can be read, for example by determining the current through the nodes 50.

The variant of the reading step described relatively to FIG. 6 can also be applied to the method of the FIGS. 8 to 10.

Figure 11:
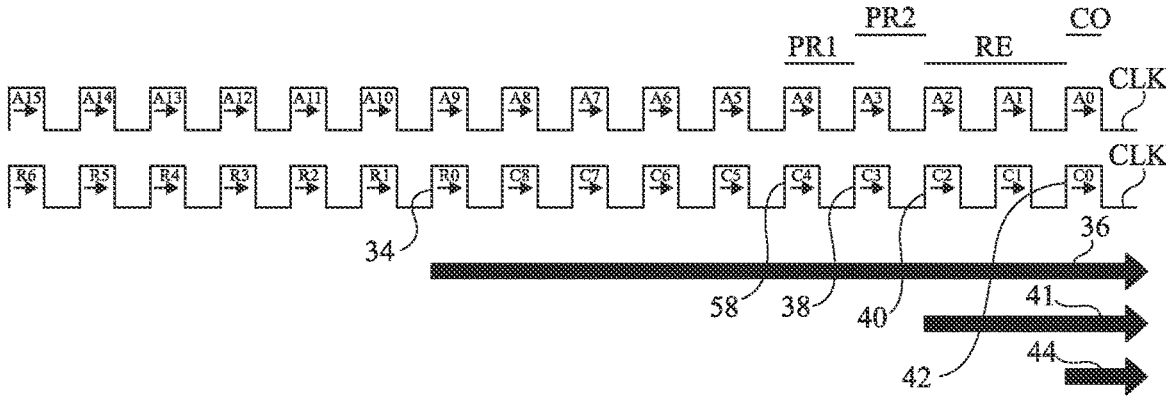
FIG. 11 schematically represents another embodiment of a reading method.

The FIG. 11 schematically represents another embodiment of a reading method. More specifically, FIG. 11 represents, as in FIGS. 4 and 8, on a clock signal CLK, bits A15 to A0 of an address provided to a memory device. In addition, FIG. 11 represents the bits on the clock signal CLK, wherein the bits correspond to the part of the address that specifies the line and the part of the address that specifies the column.

The method of FIG. 11 differs from the method of FIG. 8 in that the method of FIG. 11 comprises two pre-charging steps PR1 and PR2.

The pre-charging step PR1 starts at the rising edge 58 and ends at the rising edge 38. During the pre-charging step PR1, all the sets 32 addressed by the known partial address are pre-charged. In other words, in FIG. 11, the four sets that can be referred to by the known partial address at the rising edge 58, which means the four sets that can contain the word to read, are pre-charged.

The pre-charging step PR2 starts at the rising edge 38 and ends at the rising edge 40. At the rising edge 38, an additional bit of the address is known by the memory device. During the pre-charging step PR2, the sets 32 still referred to by the partial address remain pre-charged. The sets that are no longer referred to by the partial address are no longer pre-charged.

Thus, in the example of FIG. 11, four sets 32 are pre-charged during the step PR1 and two sets 32 are pre-charged during the step PR2.

Figure 12:
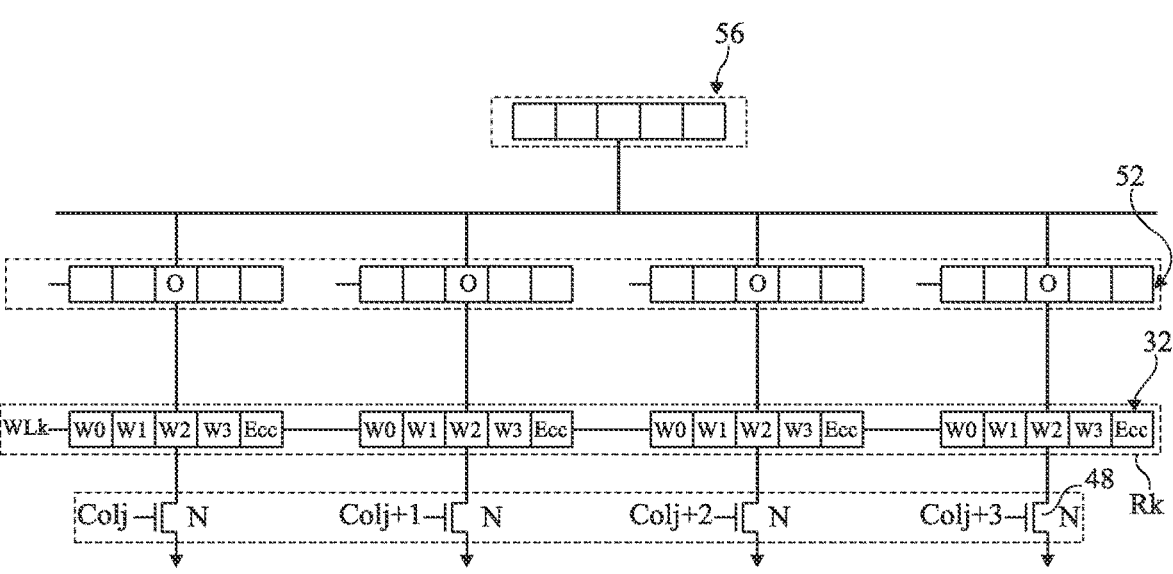
FIG. 12 schematically represents a step in the method of FIG. 11.

The FIG. 12 schematically represents a step in the method of FIG. 11. More specifically, FIG. 12 shows the pre-charging step PR1 of the embodiment according to FIG. 11.

The step of FIG. 12 corresponds to the step of FIG. 9. Thus, four sets 32 are pre-charged. Thus, the transistors 52 associated to the four sets 32 that can be addressed by the partial address are switched on. The other transistors 52 are non-conducting. In the example of FIG. 9, the four displayed sets 32 correspond to the four sets that can be addressed by the address. As at the step of FIG. 5, the transistors 48 are all non-conducting.

Thus, each pre-charged memory cell, i.e., each cell of the four sets 32 that can be addressed by the address, comprises a terminal that receives a pre-charging voltage and a terminal coupled, preferably connected, to a floating node.

Figure 13:
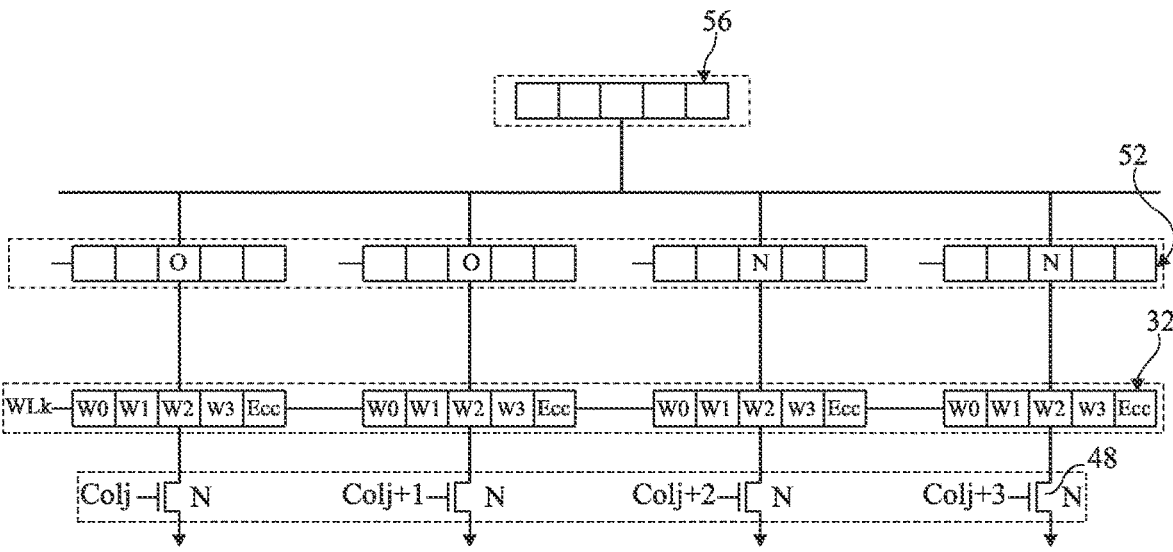
FIG. 13 schematically represents a step in the method of FIG. 11.

FIG. 13 schematically represents a step in the method of FIG. 11. More specifically, FIG. 13 shows the pre-charging step PR2 of the embodiment according to FIG. 11.

During this step, the transistors 52 of the memory cells matching each other 32 still referred to by the partial address remain on. The other transistors 52 are placed or maintained in a non-conducting state.

Then, the step of FIG. 13 is followed by a reading step like the one described in relation with FIG. 10.

According to other embodiments, the pre-charging can be made at a rising edge before the ones of the described embodiments. For example, the pre-charging can start at a rising edge corresponding to the column component of the address, while the partial address known at that moment can specify more than one set 32 of words. All the sets 32 that can be addressed by the partial address are pre-charged. For example, in the case of the embodiment of FIG. 11, the number of pre-charged sets is divided by two at each rising edge after the start of the pre-charging.

Figures 14, 15:
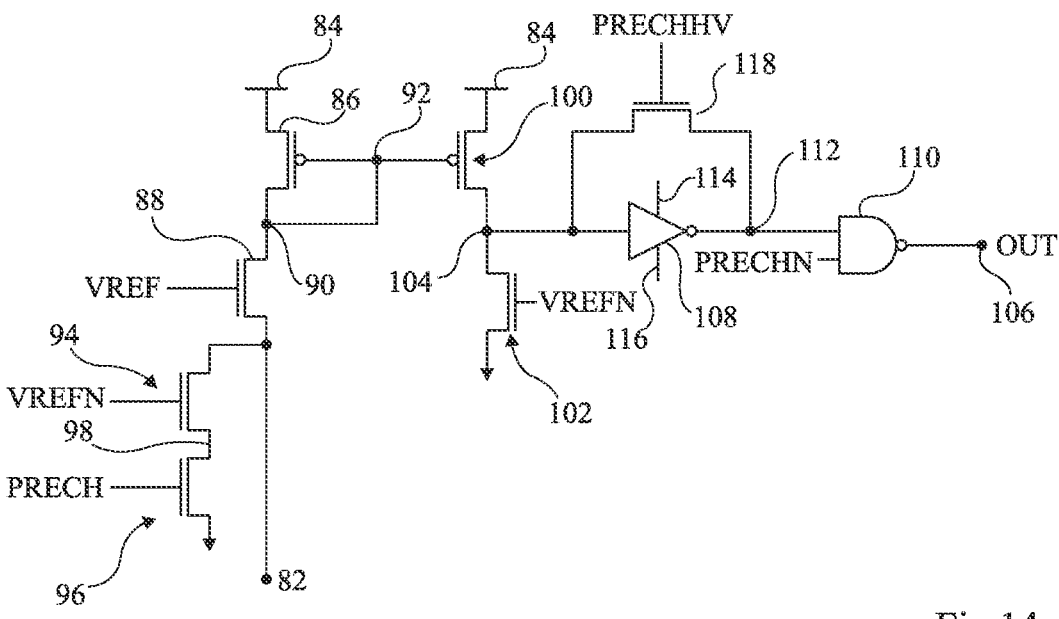
FIG. 14 represents an embodiment of a sense amplifier.
FIG. 15 represents a circuit generating voltages of the embodiment of FIG. 14.

FIG. 14 represents an embodiment of a sense amplifier 80. The sense amplifier is, for example, one of the amplifiers of the blocks 56.

The amplifier 80 comprises a terminal 82 corresponding to the terminal coupled, preferably connected, to the corresponding node 50. The terminal 82 is coupled to an application node 84 of a supply voltage VDD through transistor 86 and 88. For example, the transistors 86 and 88 are metal oxide semiconductor field effect transistors (MOSFET). For example, the transistor 86 is a P-type transistor while, for example, the transistor 88 is a N-type transistor. The transistors 86 and 88 are coupled serially. In other words, the conduction terminal, for example the source of the transistor 86, is coupled, preferably connected, to the node 84, and another conduction terminal, for example the drain of the transistor 86, is coupled, preferably connected, to a node 90. A conduction terminal, for example the drain of the transistor 88, is coupled, preferably connected, to the node 90, and another conduction terminal of the transistor 88, for example the source, is coupled, preferably connected, to a terminal 82.

The transistor 86 is diode-connected. In other words, the control terminal, for example the gate of the transistor 86, is coupled, preferably connected, to the source of the transistor 90. In other words, the control terminal of the transistor 86 is coupled, preferably connected, to a node 92, wherein the node 92 is coupled, preferably connected, to the node 90. A control terminal, for example the gate, of the transistor 88, is configured to receive a set voltage VREF.

The terminal 82 is, for example, coupled to the application node of the reference voltage GND through two transistors 94 and 96. For example, the transistors 94 and 96 are metal oxide semiconductor field effect Transistors (MOSFET). For example, the transistors 94 and 96 are N-type transistors.

The transistors 94 and 96 are serially coupled. In other words, the conduction terminal, for example the drain of the transistor 94, is coupled, preferably connected, to the terminal 82, and another conduction terminal, for example the source of the transistor 94, is coupled, preferably connected, to a node 98. A conduction terminal, for example the drain of the transistor 96, is coupled, preferably connected, to the node 98, and another conduction terminal of the transistor 96, for example the source, is coupled, preferably connected, to the application node of the reference voltage GND.

A control terminal of the transistor 94 is configured to receive a voltage VREFN. A control terminal of the transistor 96 is configured to receive a voltage PRECH. During the pre-charging step, the PRECH voltage has a value corresponding to a logic gate 1.

In addition, the amplifier 80 comprises transistors 100 and 102. For example, the transistors 100 and 102 are metal oxide semiconductor field effect transistors (MOSFET). For example, the transistor 100 is a P-type transistor while, for example, the transistor 102 is a N-type transistor. The transistors 100 and 102 are coupled serially between the node 84 and the application node of the reference voltage GND. In other words, the conduction terminal, for example the source of the transistor 100, is coupled, preferably connected, to the node 84, and another conduction terminal, for example the drain of the transistor 100, is coupled, preferably connected, to a node 104. A conduction terminal, for example the drain of the transistor 102, is coupled, preferably connected, to the node 104, and another conduction terminal of the transistor 102, for example the source, is coupled, preferably connected, to the application node of the reference voltage GND. Thus, the node 104 is the midpoint between the transistors 100 and 102.

A control terminal of the transistor 100 is coupled, preferably connected, to the node 92, so it is coupled, preferably connected, to the control terminal of the transistor 86. A control terminal of the transistor 102 is configured to receive the voltage VREFN. The voltage VREFN is a reference voltage. Preferably, the voltage VREFN is approximatively the same as the threshold voltage of the transistors 94 and 102. Thus, the transistors 94 and 102 work in saturation mode as sources of current.

The node 104 is coupled to an output node 106 of the amplifier 80 through an inverter 108 and a NAND logic gate 110. The inverter 108 is coupled between the node 104 and a node 112. More precisely, an input of the inverter 108 is coupled, preferably connected, to the node 104 and an output of the inverter 108 is coupled, preferably connected, to the node 112.

The inverter is operated by a voltage between the terminals 114 and 116 of the inverter 108. The terminal 114 is configured to receive a voltage VDDsense and the terminal 116 is configured to receive a reference voltage GNDsense. An example of device to generate the voltages VDDsense and GNDsense is pictured in FIG. 15. During the pre-charging step, the PRECHN voltage has a value corresponding to a logic gate 0.

The logic gate 110 comprises an input coupled, preferably connected, to the node 112. Another input of the logic gate 110 is configured to receive a voltage PRECHN. The output of the logic gate 110 is coupled, preferably connected, to the output node 106.

The input and the output of the inverter 108 are coupled through a transistor 118. For example, the transistor 118 is a MOSFET transistor, for example a N-type transistor. A conduction terminal of the transistor 118, for example the drain, is coupled, preferably connected, to the node 104 and another conduction terminal, for example the source of the transistor 118, is coupled, preferably connected, to the node 112.

A control terminal, for example the gate, of the transistor 118, is configured to receive a voltage PRECHHV. The function of the voltage PRECHHV is to secure enough conduction of the transistor 118, so that the voltage source-drain Vds is nearly zero. The nodes 104 and 112 are then under similar potentials, which polarizes the inverter 114 at its switching point. More precisely, the voltage PRECHHV is a signal with a value that matches the logic value 0 during the reading step, with a value high enough during the pre-charging step so that the nodes 104 and 112 are at potentials close to each other, for example fundamentally equal to each other, thanks to the conduction through the transistor 118. This level must be noticeably higher than the switching threshold of the inverter 114 plus the threshold voltage of the transistor 118. It may be higher than the supply voltage VDD.

During the reading of a memory cell according to the embodiments described above, for example, the function of the amplifier is following.

The transistor 102 is configured to be subjected to a current, for example 2 μA. According to the current through the transistor 100, the voltage on the node 104 corresponds to the supply voltage of the node 84 or to the reference voltage. More precisely, if the current through the transistor 100 is higher than the current through the transistor 102, the voltage on the node 104 is the supply voltage. If the current through the transistor 100 is lower than the current through the transistor 102, the voltage on the node 104 is the reference voltage.

During the pre-charging step, the PRECH voltage has a value corresponding to a logic gate 1. Thus, the transistor 96 is on and the node 98 is switched to the reference potential. The transistor 94 that received the voltage VREFN on it gate injects a reference current to the transistor 86 through the transistor 88 that is mounted with a common gate. This current is homothetically copied by the transistor 100. This current and the dimensions of the transistors 86 and 100 are configured so that the current through the transistor 100 is substantially identical to the current through the transistor 102. This yields substantially no current resulting from the currents received by the node 104 from the transistors 100 and 102.

During the pre-charging, the transistor 118 is on and biases at the same potential the input and the output of the inverter 108, which sets 104 at the switching threshold of the inverter 108.

During the reading of the memory cell, the voltage at the output of the logic gate 110 depends on the state of the memory cell.

For example, the inverter 108 comprises a P-type MOSFET transistor and a N-type MOSFET transistor serially coupled between the application node of the supply voltage VDD and the application node of the reference potential. The body of the P-type MOSFET transistor is coupled to the application node of the supply voltage VDD, the source of the MOSFET P-type transistor is coupled to the terminal 114, the substrate of the N-type MOSFET transistor is coupled to the application node of the reference potential, and the source of the MOSFET N-type transistor is coupled to the terminal 116. The gates of said transistors are coupled together to the input 104, with their drains coupled together to the output 112.

During the pre-charging step, when the inverter 108 is biased to its switching threshold, the N-type MOSFET transistor and the P-type MOSFET transistor are simultaneously conducting, which leads to a potentially high consumption between the terminals 114 and 116. To reduce this consumption, the amplifier 80 comprises a circuit 120 that is described more in detail in relation with FIG. 15, which comprises identical impedances in a series between the terminal 114 and the application node of the operating voltage VDD on one hand, between the terminal 116 and the application node of the reference voltage on the other hand. These identical impedances increase the potential of the terminal 116 and reduce the potential of the terminal 114 by two fundamentally identical values. By reducing the gate-source voltages of the N- and P-channel MOSFET transistors, they strongly reduce the current through the terminals 114 and 116.

Out of the pre-charging steps, the circuit 120 is preferably configured so that the inverter is biased a classical way, with the node 114 biased to the supply voltage VDD and the node 116 biased to the reference potential.

FIG. 15 represents a circuit 120 generating voltages of the embodiment of FIG. 14. For example, the circuit 120 is configured to generate the voltages VDDsense and GND-sense as described relatively to FIG. 14.

The circuit 120 comprises an input 122 and outputs 124 and 126. The input 122 is configured to receive the voltage PRECH. The output 124 is configured to provide the voltage VDDsense, which means the voltage applied to the terminal 114 of FIG. 14. The output 126 is configured to provide the voltage GNDsense, which means the voltage applied to the terminal 116 of FIG. 14.

The output 124 is coupled to the node 84 through a resistor 128 and a transistor 130 coupled in parallel. For example, the transistor 130 is a MOSFET transistor, for example a P-type transistor. In other words, the resistor 128 is coupled between the node 84 and the output 124. For example, the transistor 130 is coupled between the node 84 and the output 124. In other words, a terminal of the resistor 128 is coupled, preferably connected, to the node 84, and another terminal of the resistor 128 is coupled, preferably connected, to the output 124. In other words, the conduction terminal, for example the source of the transistor 130, is coupled, preferably connected, to the node 84, and another conduction terminal, for example the drain of the transistor 130, is coupled, preferably connected, to the output 124.

The output 126 is coupled to the application node of the reference voltage GND through a resistor 132 and a transistor 134 coupled in parallel. For example, the transistor 134 is a MOSFET transistor, for example a N-type transistor. In other words, the resistor 132 is coupled between the application node of the reference voltage GND and the output 126. Similarly, the transistor 134 is coupled between the application node of the reference voltage GND and the output 126. In other words, a terminal of the resistor 132 is coupled, preferably connected, to the application node of the reference voltage GND, and another terminal of the resistor 132 is coupled, preferably connected, to the output 126. Similarly, a conduction terminal, for example the source of the transistor 134, is coupled, preferably connected, to the application node of the reference voltage GND, and another conduction terminal, for example the drain of the transistor 134, is coupled, preferably connected, to the output 126.

A control terminal of the transistor 130 is coupled, preferably connected, to the input 122. A control terminal of the transistor 134 is coupled to the input 122 through a inverter 136. In other words, an input of the inverter 136 is coupled, preferably connected, to the input 122 and an output of the inverter 136 is coupled, preferably connected, to the transistor control 134.

During the pre-charging step, which means when the PRECH voltage has a value corresponding to a logic gate 1, the transistor 130 is non-conducting. The terminal 124, corresponding to the terminal 114 of FIG. 14, is coupled to the application node of the voltage VDD through the resistor 128 and the terminal 126, corresponding to the terminal 116 of FIG. 14, is coupled to the application node of the reference potential through the resistor 132. Out of the pre-charging step, which means when the voltage PRECH has a value corresponding to the logic value 0, the terminal 124, corresponding to the terminal 114 of FIG. 14, is coupled to the application node of the voltage VDD through the resistor 130 and the terminal 126, corresponding to the terminal 116 of FIG. 14, is coupled to the application node of the reference potential through the resistor 134.

During the pre-charging step, the node 112 at the switching potential of the inverter 108 can lead to overconsumption in the NAND gate 110 and to an indefinite state at the output. The input voltage PRECHN of the gate 110, whose logic value is 0 during the pre-charging step, is made to prevent these two problems.

According to an embodiment, the circuit 120 is common to several amplifiers 80, for example common to all the amplifiers 80.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A memory device comprising a sense amplifier;
wherein the sense amplifier comprises a first inverter, wherein an input and an output of the first inverter are coupled to a first transistor configured to be switched on during a pre-charging step of a memory cell;
wherein the sense amplifier further comprises a NAND logic gate, having a first input coupled to the output of the first inverter and a second input coupled to an application node of a first voltage, the output of the NAND logic gate being coupled to an output of the sense amplifier; and
wherein the first voltage is configured to be equal to a second reference voltage during the pre-charging step and to be equal to a third supply voltage during a step of reading the memory cell.

2. The memory device of claim 1, wherein the sense amplifier comprises a second transistor and a third transistor coupled in series between an application node of the third supply voltage and an application node of the second reference voltage, wherein a midpoint between the second transistor and the third transistor is coupled to the input of the first inverter.

3. The memory device of claim 1, wherein the sense amplifier comprises a fourth transistor and a fifth transistor coupled in series between an application node of the third supply voltage and a terminal of the memory cell, wherein the fourth transistor is diode-connected, a control terminal of the fourth transistor being coupled to a control terminal of a second transistor.

4. The memory device of claim 1, wherein the sense amplifier comprises a sixth transistor and a seventh transistor coupled in series between a terminal of the memory cell and an application node of the second reference voltage.

5. The memory device of claim 4, wherein currents through a second transistor and a third transistor are substantially equal and depend on a current through the sixth transistor.

6. The memory device of claim 4, wherein the memory device is configured such that, during the pre-charging step, the first voltage is equal to the second reference voltage and a control terminal of the first transistor and a control terminal of the seventh transistor are at least equal to the third supply voltage.

7. The memory device of claim 4, wherein the memory device is configured such that, during the step of reading, the first voltage is equal to the third supply voltage and control terminals of the first transistor and the seventh transistor are equal to the second reference voltage.

8. The memory device of claim 7, wherein the first inverter is configured to be supplied by a fourth voltage applied between first and second terminals of the first inverter, wherein the fourth voltage is distinct from the third supply voltage.

9. A method of controlling a memory device comprising a sense amplifier, wherein the sense amplifier comprises a first inverter, wherein an input and an output of the first inverter are coupled to a first transistor, the method comprising switching on the first transistor during a pre-charging step of a memory cell;

wherein the sense amplifier further comprises a NAND logic gate, having a first input coupled to the output of the first inverter and a second input coupled to an application node of a first voltage, the output of the NAND logic gate being coupled to an output of the sense amplifier; and wherein the first voltage is configured to be equal to a second reference voltage during the pre-charging step and to be equal to a third supply voltage during a step of reading the memory cell.

10. The method of claim 9, wherein the sense amplifier comprises a second transistor and a third transistor coupled in series between an application node of the third supply voltage and an application node of the second reference voltage, wherein a midpoint between the second transistor and the third transistor is coupled to the input of the first inverter.

11. The method of claim 9, wherein the sense amplifier comprises a fourth transistor and a fifth transistor coupled in series between an application node of the third supply voltage and a terminal of the memory cell, wherein the fourth transistor is diode-connected, a control terminal of the fourth transistor being coupled to a control terminal of a second transistor.

12. The method of claim 9, wherein the sense amplifier comprises a sixth transistor and a seventh transistor coupled in series between a terminal of the memory cell and an application node of the second reference voltage.

13. The method of claim 12, wherein currents through a second transistor and a third transistor are substantially equal and depend on a current through the sixth transistor.

14. The method of claim 12, wherein the memory device is configured such that, during the pre-charging step, the first voltage is equal to the second reference voltage and a control terminal of the first transistor and a control terminal of the seventh transistor are at least equal to the third supply voltage.

15. The method of claim 12, wherein the memory device is configured such that, during the step of reading, the first voltage is equal to the third supply voltage and control terminals of the first transistor and the seventh transistor are equal to the second reference voltage.

16. The method of claim 15, wherein the first inverter is configured to be supplied by a fourth voltage applied between first and second terminals of the first inverter, wherein the fourth voltage is distinct from the third supply voltage.

* * * * *